(12) United States Patent
Song et al.

(10) Patent No.: US 9,058,464 B2
(45) Date of Patent: Jun. 16, 2015

(54) CUSTOMER AIRCRAFT CUSTOMIZATION SYSTEM

(75) Inventors: Taiboo Song, Woodinville, WA (US); Lorene S. Paulette, Everett, WA (US)

(73) Assignee: THE BOEING COMPANY, Chicago, IL (US)

( * ) Notice: Subject to any disclaimer, the term of this patent is extended or adjusted under 35 U.S.C. 154(b) by 405 days.

(21) Appl. No.: 13/328,260

(22) Filed: Dec. 16, 2011

(65) Prior Publication Data

US 2013/0158955 A1 Jun. 20, 2013

(51) Int. Cl.
*G06G 7/48* (2006.01)
*G06F 17/50* (2006.01)

(52) U.S. Cl.
CPC ........ *G06F 17/5095* (2013.01); *G06F 17/5018* (2013.01)

(58) Field of Classification Search
CPC . G06F 17/5095; G06F 17/50; G06F 17/5081; G06F 17/5086; G06F 17/5004; G06F 17/5018; G06T 17/00; G06T 19/00
USPC .................................................. 703/1, 6, 7, 8
See application file for complete search history.

(56) References Cited

U.S. PATENT DOCUMENTS

| | | | |
|---|---|---|---|
| 6,035,305 A | 3/2000 | Strevey et al. | |
| 6,968,298 B2 | 11/2005 | Lohmann et al. | |
| 7,529,649 B2 | 5/2009 | Lee et al. | |
| 8,060,345 B2 | 11/2011 | Lee et al. | |
| 2002/0026296 A1* | 2/2002 | Lohmann et al. | 703/1 |
| 2002/0161563 A1* | 10/2002 | Elabiad et al. | 703/8 |
| 2004/0153295 A1 | 8/2004 | Lohmann et al. | |
| 2005/0055180 A1 | 3/2005 | Pischke et al. | |
| 2007/0233433 A1* | 10/2007 | Lee et al. | 703/1 |
| 2010/0145492 A1* | 6/2010 | Russell | 700/103 |
| 2011/0172795 A1* | 7/2011 | Hansen et al. | 700/97 |

FOREIGN PATENT DOCUMENTS

| | | |
|---|---|---|
| DE | 102011016293 A1 | 10/2011 |
| WO | WO0273473 A1 | 3/2002 |

OTHER PUBLICATIONS

Reed, John A. et al., "Improving the Aircraft Design Process Using Web-Based Modeling and Simulation", Jan. 2000, Transactions on Modeling and Computer Simulation, vol. 10, No. 1, ACM.*
Extended European Search Report, dated Mar. 28, 2013, regarding Application No. EP12196760.8-1960, applicant The Boeing Company, applicant reference P56343EP/RGH, 7 pages.

* cited by examiner

*Primary Examiner* — Kandasamy Thangavelu
*Assistant Examiner* — Cedric D Johnson
(74) *Attorney, Agent, or Firm* — Yee & Associates, P.C.

(57) ABSTRACT

A method and apparatus for managing options for an aircraft. A selected option for the aircraft is received. A number of engineering options is identified for the selected option. The number of engineering options is in an aircraft option database comprising engineering options for the options for the aircraft. An engineering option in the engineering options is a pre-certified design meeting a group of regulations pertaining to airworthiness of the pre-certified design in the aircraft. A final design including the number of engineering options associated with resources in which the final design is for building the selected option in the aircraft is generated using the number of engineering options identified in the aircraft option database for the selected option.

17 Claims, 8 Drawing Sheets

CUSTOMER AIRCRAFT CUSTOMIZATION SYSTEM

BACKGROUND INFORMATION

1. Field

The present disclosure relates generally to aircraft and, in particular, to designing and manufacturing an aircraft. Still more particularly, the present disclosure relates to a method and apparatus for customizing an aircraft for customers.

2. Background

Aircraft that are purchased by customers may have different configurations. When a customer considers purchasing a particular model of an aircraft, that model may have different versions from which the customer may select. For example, the customer may select from a passenger version and a cargo version of the model of the aircraft. As another example, a particular model may have several different versions designed for carrying passengers. A customer looking for a passenger aircraft may select between different passenger versions for the model of the aircraft.

After selecting a model and version of an aircraft, the customer also may customize a particular version of the chosen aircraft model. For example, when a customer selects a passenger version of an aircraft, the customer also may pick various options for that version of the aircraft. For example, the customer may pick options relating to galleys, lavatories, attendant seating, passenger seating, landing gear, engines, and other suitable options.

Depending on the options selected, designs are generated for those customer-selected options. For example, with a lavatory, a customer may have the option to select how many lavatories are present in the aircraft, the locations of the lavatories, and different features for the lavatories. Features that the customer may select include, for example, without limitation, a color, a texture, a soap dispenser system, a baby care table, and other features for the lavatory.

With the selection of options, a design is generated for the customer-selected option. The design for the option is put through a process to certify the option as being airworthy. In other words, a process is followed to obtain a certification that the option meets regulations governing the airworthiness of the aircraft.

For example, the Federal Aviation Administration (FAA) propagates regulations for certifying the airworthiness of an aircraft. These requirements include certifying designs for an aircraft. These designs include those for customer-selected options. This process for certifying customer-selected options may take more time than desired.

As a result, the time needed for certification may cause delays in delivering an aircraft to a customer. Further, the time and equipment used in the certification process for customer-selected options also may increase the cost of manufacturing the aircraft for a customer.

Therefore, it would be desirable to have a method and apparatus that reduces the amount of time needed to manufacture an aircraft when customer-selected options are present in the aircraft.

SUMMARY

In one illustrative embodiment, an aircraft customization system comprises an aircraft option database, an aircraft configurator coupled to the aircraft option database, and a configuration generator coupled to the aircraft configurator. The aircraft option database comprises engineering options for options for an aircraft. An engineering option in the engineering options is a pre-certified design meeting a group of regulations pertaining to airworthiness of the pre-certified design in the aircraft. The aircraft configurator is configured to receive a selected option for the aircraft and identify a number of engineering options from the engineering options in the aircraft option database for the selected option. The configuration generator is configured to generate a final design including the number of engineering options associated with resources in which the final design is for building the selected option in the aircraft using the number of engineering options identified in the aircraft option database by the aircraft configurator for the selected option.

In another illustrative embodiment, a vehicle customization system comprises a database, a vehicle configurator, and a configuration generator. The database comprises pre-certified designs for options for a vehicle. The pre-certified designs in the database meet a group of regulations on use of the pre-certified designs in the vehicle. The vehicle configurator is configured to receive a selected option for the vehicle and identify a number of engineering options from engineering options in the database for the selected option. The configuration generator is configured to generate a final design including the number of engineering options associated with resources in which the final design is for building the selected option in the vehicle using the number of the pre-certified designs identified in the database for the selected option.

In yet another illustrative embodiment, a method for managing options for an aircraft is present. A selected option for the aircraft is received. A number of engineering options is identified for the selected option. The number of engineering options is in an aircraft option database comprising engineering options for the options for the aircraft. An engineering option in the engineering options is a pre-certified design meeting a group of regulations pertaining to airworthiness of the pre-certified design in the aircraft. A final design including the number of engineering options associated with resources in which the final design is for building the selected option in the aircraft is generated using the number of engineering options identified in the aircraft option database for the selected option.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The different illustrative embodiments recognize and take into account one or more considerations. For example, the different illustrative embodiments recognize and take into account that currently, each time an option is selected, a new design is generated for that option. The different illustrative embodiments recognize and take into account that generating a new design each time an option is selected requires certification of the new design for use in the aircraft.

The illustrative embodiments recognize and take into account that generating a fixed number of pre-certified designs for options may reduce the amount of time needed to manufacture an aircraft having customer-selected options. For example, the illustrative embodiments recognize and take into account that a design for an option selected by a customer may be certified as meeting a group of regulations pertaining to the airworthiness of the design in the aircraft the first time the design is used. This design may be saved for use the next time the option is selected.

A collection of these certified designs may be generated for options offered to customers. As a result, the selection of one of these options by a customer may reduce the time needed to manufacture and deliver the aircraft to the customer.

In one illustrative embodiment, an aircraft customization system comprises an aircraft option database, an aircraft configurator, and a document generator. The aircraft option database comprises engineering options for options for an aircraft. An engineering option in the engineering options comprises a pre-design meeting a group of regulations pertaining to the airworthiness of the design in the aircraft.

The aircraft configurator is coupled to the aircraft option database and is configured to receive a selected option for an aircraft and identify a number of engineering options from the engineering options in the aircraft option database for the selected option. The configuration generator is coupled to the aircraft configurator and is configured to generate a document for building the selected option in the aircraft using the number of engineering options identified in the aircraft option database for the selected option.

Figure 1:
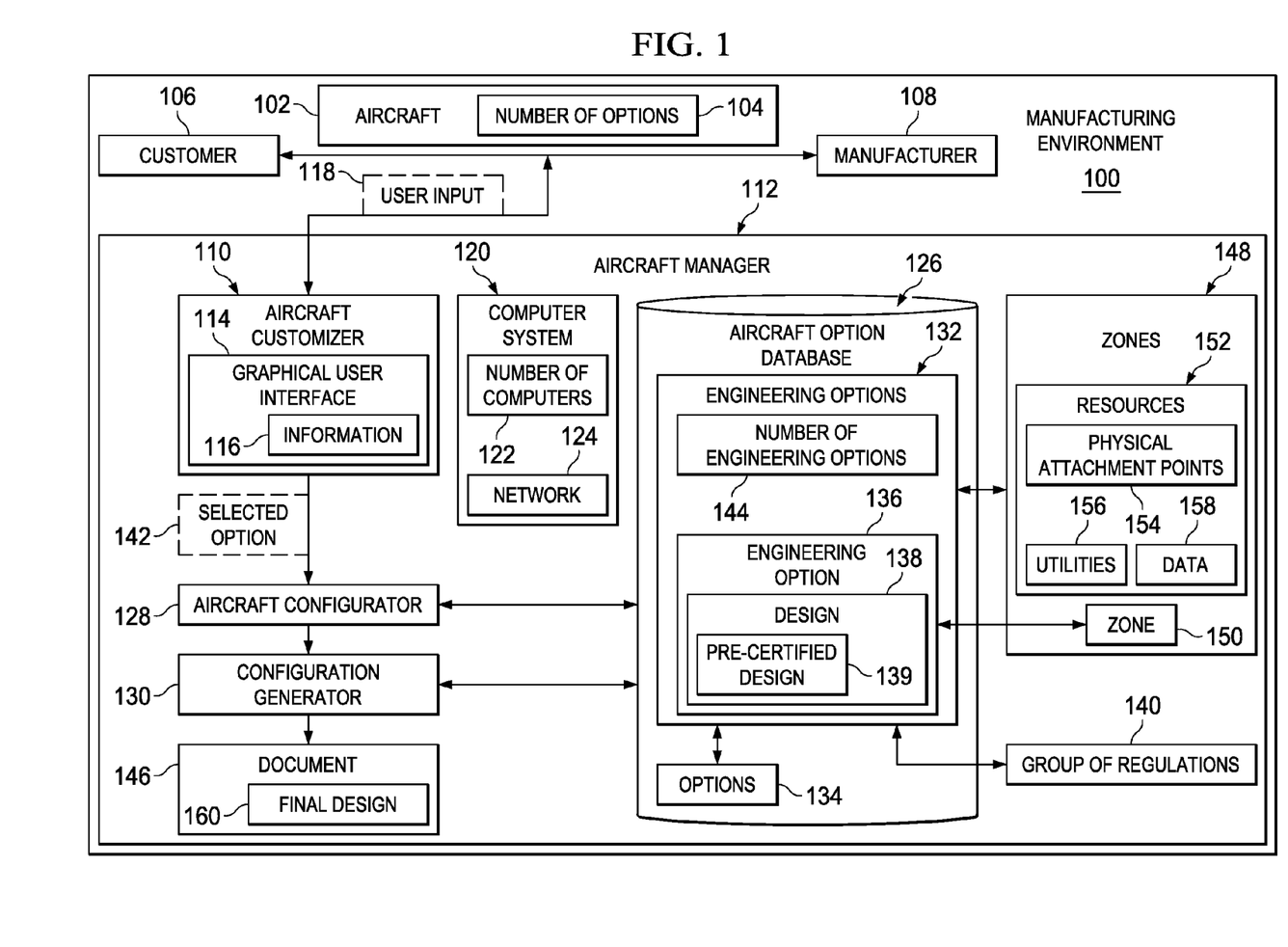
FIG. 1 is an illustration of a block diagram of a configuration environment in accordance with an illustrative embodiment.

With reference now to the figures, and in particular, with reference to FIG. 1, an illustration of a block diagram of a configuration environment is depicted in accordance with an illustrative embodiment. As depicted, manufacturing environment 100 is used to manufacture aircraft 102. Aircraft 102 has number of options 104 selected by customer 106. Number of options 104 may be built into aircraft 102 when manufacturing aircraft 102 for customer 106 in accordance with an illustrative embodiment. In other words, aircraft 102 is a deliverable to customer 106.

In these illustrative examples, customer 106 may work with manufacturer 108 to select number of options 104. As used herein, a "number of" when used with reference to items, means one or more items. For example, "number of options 104" is one or more options.

In these illustrative examples, number of options 104 may be selected using aircraft customizer 110 in aircraft manager 112. Aircraft customizer 110 includes graphical user interface 114. Graphical user interface 114 is configured to display information 116 about aircraft 102 and number of options 104. Additionally, graphical user interface 114 is also configured to receive user input 118 to select number of options 104 for aircraft 102. User input 118 may be entered by customer 106 or manufacturer 108 depending on the particular implementation.

In these illustrative examples, aircraft manager 112 also may include aircraft option database 126, aircraft configurator 128, and configuration generator 130. These components also may be implemented in hardware, software, or a combination of the two. As depicted in this example, these components are implemented within computer system 120.

Aircraft option database 126 comprises engineering options 132 for options 134 that may be selected for aircraft 102. In this illustrative example, selected option 142 is an option in number of options 104 selected by customer 106. In this illustrative example, engineering option 136 in engineering options 132 is associated with selected option 142 in options 134. Selected option 142 is an assembly of components for aircraft 102. In these illustrative examples, selected option 142 may be selected from at least one of a galley, an attendant seat, a lavatory, a passenger seat, a landing gear, an engine, and other suitable options.

As depicted, engineering option 136 includes design 138. Design 138 may include some or all of the information needed to build selected option 142.

As depicted, design 138 contains all of the information needed to build selected option 142 in aircraft 102. Design 138 may include, for example, without limitation, at least one of a two-dimensional model, a three-dimensional model, dimensions, identification materials, regulations, notes, and other suitable information. Design 138 may be comprised of a single file or multiple files containing the information.

As used herein, the phrase "at least one of", when used with a list of items, means different combinations of one or more of the listed items may be used and only one of each item in the list may be needed. For example, "at least one of item A, item B, and item C" may include, for example, without limitation, item A or item A and item B. This example also may include item A, item B, and item C, or item B and item C.

In other examples, "at least one of" may be, for example, without limitation, two of item A, one of item B, and ten of item C; four of item B and seven of item C; and other suitable combinations.

In these illustrative examples, design 138 is a design that meets group of regulations 140 for aircraft 102. In particular, design 138 is a design that meets group of regulations 140 pertaining to the airworthiness of design 138 in aircraft 102. In other words, design 138 is pre-certified design 139 in these illustrative examples.

As depicted, all of engineering options 132 are comprised of pre-certified designs. Of course, in some illustrative examples, some of engineering options 132 may not be already certified, depending on the particular implementation.

In these illustrative examples, group of regulations 140 is one or more rules. These rules may be from one or more sources. For example, group of regulations 140 may be rules promulgated by the Federal Aviation Administration with respect to the airworthiness of design 138 for use in aircraft 102. In other illustrative examples, group of regulations 140 may be rules from other agencies, countries, or entities. For example, group of regulations 140 may include rules from a government agency and manufacturer 108.

Configuration generator 130 is configured to receive selected option 142. Aircraft configurator 128 is coupled to the aircraft option database 126. Aircraft configurator 128 also is configured to identify number of engineering options 144 in aircraft option database 126 for selected option 142.

As used herein "coupled to" when used with reference to items means that the items are in communication with each other. These components may be in communication with each other through media selected from at least one of a wired communications link, an optical communications link, a wireless communications link, a shared memory, a network, a local area network, an intranet, and other suitable types of media that allow for communication between the items. The communication may be uni-directional or bi-directional. For example, aircraft configurator 128 is in communication with aircraft option database 126 when aircraft configurator 128 is coupled to aircraft option database 126.

In these illustrative examples, engineering options 132 for options 134 may be associated with zones 148. In other words, one or more engineering options in engineering options 132 may be assigned to each zone in zones 148. Zones 148 are regions within aircraft 102. Zones 148 may be two-dimensional or three-dimensional depending on the particular implementation. Zones 148 may be selected as part of selecting options 134. Based on zones 148 selected for options 134, applicable engineering options in engineering options 132 may be selected.

For example, zone 150 in zones 148 is selected for selected option 142. Based on selected option 142 in zone 150, engineering option 136 is identified for selected option 142. If a different zone is selected other than zone 150, a different engineering option other than engineering option 136 may be used, depending on the particular implementation.

In these illustrative examples, zones 148 are regions in which resources 152 are defined as being available for options 134. Resources 152 may include at least one of physical attachment points 154, utilities 156, data 158, and other suitable resources. Physical attachment points 154 are points in which components for selected option 142 may be attached to aircraft 102. Utilities 156 may include, for example, without limitation, at least one of power, air, hydraulic fluids, and other suitable utilities. Data 158 may be access to data needed for selected option 142. The interfaces to attach resources 152 to components for engineering option 136 are based on the selection of a zone, such as zone 150 in zones 148.

Configuration generator 130 is configured to generate document 146 for building selected option 142 in aircraft 102 using number of engineering options 144 identified in aircraft option database 126 for selected option 142. In other words, document 146 contains the information needed to manufacture selected option 142 in aircraft 102. For example, document 146 may include final design 160. In other illustrative examples, document 146 may include two-dimensional drawings, three-dimensional drawings, an identification of materials needed, processes used to manufacture materials, assembly instructions, inspection instructions, and other suitable types of information used to build selected option 142 in aircraft 102 in addition to and/or in place of final design 160.

Document 146 may take various forms. For example, document 146 may be a work statement, a proposal, a bid, manufacturing instructions, and other suitable types of documents. When document 146 takes the form of a work statement, this document may define tasks, deliverables, timelines, costs, regulatory and governance terms and conditions, and other information. More specifically, when document 146 is a work statement, document 146 may be a manufacturing work statement that is created for use in manufacturing the option. In these illustrative examples, document 146 also may include information for other options of portions of aircraft 102. In other words, document 146 may be a manufacturing work statement for all of aircraft 102, depending on the particular implementation. When document 146 is final design 160 for manufacturing aircraft 102, final design 160 may include engineering option 136. Final design 160 may include engineering option 136 associated with resources 152 for engineering option 136. The resources may be selected based on zone 150 selected for engineering option 136. The association of resources 152 with the components in engineering option 136 may be at an interface in zone 150.

In these illustrative examples, aircraft customizer 110, aircraft configurator 128, configuration generator 130, and other components within aircraft manager 112 may be implemented in hardware, software, or a combination of the two. For example, these components may be implemented in computer system 120.

Computer system 120 comprises number of computers 122. Additionally, when more than one computer is present in computer system 120, the computers may communicate with each other through network 124. Computer system 120 may be in a single location or may be distributed in different locations such as at the location of customer 106 and manufacturer 108.

When software is used, operations performed by these components may be implemented in program code configured to run on a processor unit in number of computers 122 within computer system 120. When hardware is employed, the hardware may include circuits that perform the operations in the components.

In the illustrative examples, the hardware may take the form of a circuit system, an integrated circuit, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. Additionally, the processes may be implemented in organic components integrated with inorganic components and/or may be comprised entirely of organic components excluding a human being.

Thus, manufacturing environment 100 may be used to manufacture a product, such as aircraft 102, as a deliverable to customer 106. As illustrated in the examples, aircraft 102 includes selected option 142. Selected option 142 is manufactured from final design 160 including number of engineering options 144 associated with resources 152 in aircraft 102. As depicted, number of engineering options 144 is a number of pre-certified designs that reduce the time needed to manufacture aircraft 102 with selected option 142. In other words, aircraft 102 embodies final design 160, which is used for building selected option 142 in aircraft 102.

In some illustrative examples, document 146 may include final design 160 as part of a certification package. For example, document 146 also may include descriptions of final design 160 as well as verifications that the hardware components in aircraft 102 match final design 160.

The illustration of manufacturing environment 100 in FIG. 1 is not meant to imply physical or architectural limitations to the manner in which an illustrative embodiment may be implemented. For example, although manufacturing environment 100 has been described with respect to aircraft 102, the different illustrative embodiments may be applied to other types of platforms.

For example, without limitation, other illustrative embodiments may be applied to a mobile platform, a stationary platform, a land-based structure, an aquatic-based structure, a space-based structure, and/or some other suitable platform. More specifically, the different illustrative embodiments may be applied to, for example, without limitation, a submarine, a bus, a personnel carrier, a tank, a train, an automobile, a spacecraft, a space station, a satellite, a surface ship, a power plant, a dam, a manufacturing facility, a building, and/or some other suitable platform.

As still another illustrative example, aircraft configurator 128 and configuration generator 130 are illustrated as separate functional blocks. These blocks may be implemented as separate components or as a single component depending on the particular implementation. In yet another illustrative example, aircraft option database 126 is shown as a single function component. This component may be implemented as a distributed database that may be located in different locations, depending on the particular implementation.

In another illustrative example, engineering option 136 may include other information in addition to design 138. For example, engineering option 136 may include cost, time to build, and other information about selected option 142. In some illustrative examples, the information may not be part of design 138 and may be included in engineering option 136.

Figure 2:
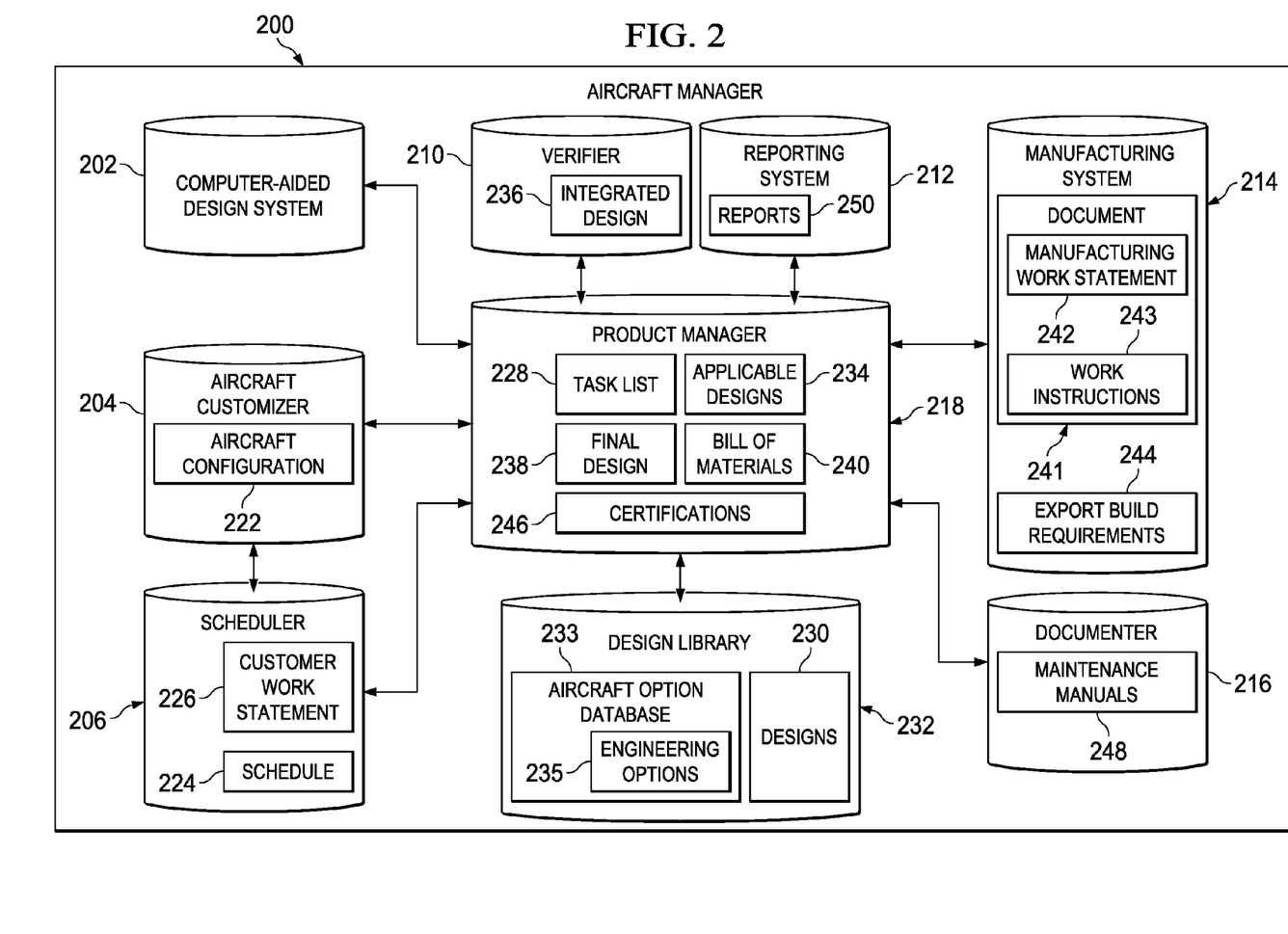
FIG. 2 is an illustration of a block diagram of an aircraft customization system in accordance with an illustrative embodiment.

With reference now to FIG. 2, an illustration of a block diagram of an aircraft customization system is depicted in accordance with an illustrative embodiment. In this illustrative example, aircraft manager 200 is an example of an implementation for aircraft manager 112 in FIG. 1.

In this illustrative example, aircraft manager 200 comprises computer-aided design system 202, aircraft customizer 204, scheduler 206, verifier 210, reporting system 212, manufacturing system 214, documenter 216, and product manager 218. As depicted, computer-aided design system 202, aircraft customizer 204, scheduler 206, verifier 210, reporting system 212, manufacturing system 214, and documenter 216 are coupled to product manager 218. Product manager 218 is configured to integrate different aspects and portions of the life cycle of an aircraft. One or more of these components in aircraft manager 200 may include functions for at least one of aircraft customizer 110, aircraft configurator 128, and configuration generator 130.

Computer-aided design system 202 is configured to generate designs in the form of computer-aided design (CAD) files in these illustrative examples. These designs may be for different assemblies, components, structures, and other items in an aircraft.

As depicted, aircraft customizer 204 is configured to customize an aircraft for a customer. Aircraft customizer 204 may be used to select different models of aircraft and different versions within aircraft models. Further, aircraft customizer 204 is configured to receive selections of options for different aircraft. Aircraft customizer 204 is an example of an implementation of aircraft customizer 110 in FIG. 1.

In the illustrative examples, scheduler 206 is coupled to aircraft customizer 204 as well as being coupled to product manager 218. Scheduler 206 is configured to generate schedules for designing and manufacturing an aircraft. Verifier 210 is configured to verify designs for aircraft configured through aircraft customizer 204. Reporting system 212 is configured to generate reports 250 about the aircraft. These reports may be generated during different phases in the life cycle of an aircraft. For example, reports 250 may be generated to identify the progress in manufacturing the aircraft, after final design 238 is generated, or after delivery of the aircraft. Of course, reports 250 also may be generated during design, customization, manufacturing, maintenance, and other phases in the life cycle of an aircraft. Final design 238 is the design that is used to manufacture or build the aircraft.

Reports 250 may take various forms. For example, the reports may be reports on cost, timelines, components used, materials used, certification process, and other suitable types of reports.

Manufacturing system 214 is configured to manage a design for an aircraft to generate instructions and other documents used to build the aircraft. Documenter 216 is configured to generate documents for use in maintenance of the aircraft after it has been produced and delivered to a customer.

In the life cycle of an aircraft, many different operations using aircraft manager 200 are performed. In one illustrative example, aircraft configuration 222 is generated using aircraft customizer 204. A customer may select a model of an aircraft, a version of an aircraft, and options for an aircraft through aircraft customizer 204. This process may be performed by a customer alone or with the aid of a manufacturer.

After aircraft configuration 222 is created, schedule 224 and customer work statement 226 are generated by scheduler 206. Schedule 224 is a schedule for the manufacturing of an aircraft in this depicted example. With schedule 224, the aircraft is placed in line for manufacturing in these illustrative examples.

Customer work statement 226 is a document that defines activities, deliverables, timelines, and other information to be performed for the customer with respect to the aircraft. Customer work statement 226 may be included as part of a contract between the customer and the manufacturer in these illustrative examples.

Product manager 218 receives schedule 224 and generates task list 228. Task list 228 is a list of actions that are to be performed in manufacturing the aircraft. These actions may include actions to be performed by operators in the manufacture of the aircraft or by vendors to the manufacturer.

Product manager 218 also obtains designs 230. Designs 230 are stored in design library 232. These designs in design library 232 are managed by product manager 218.

Designs 230 in design library 232 may be generated by computer-aided design system 202 or imported from other sources, depending on the particular implementation. Design library 232 also includes aircraft option database 233 in these illustrative examples, as well as other designs used to manufacture aircraft 102. Aircraft option database 233 includes engineering options 235. As depicted, aircraft option database 233 may be, for example, aircraft option database 126 in FIG. 1. Designs 230 may be all of the designs that may be used for aircraft 102, regardless of the version or options.

Product manager 218 identifies applicable designs 234 from designs 230. Applicable designs 234 are identified from designs 230 as designs that are applicable to aircraft configuration 222 selected by the customer. In other words, designs for particular versions and options of aircraft 102 are selected to form applicable designs 234. Applicable designs 234 also may include engineering options 235 for the option or options selected by the customer in aircraft configuration 222. In other words, engineering options from engineering options 235 are included for each of the options that are applicable in these illustrative examples.

Verifier 210 then generates integrated design 236 from designs 230 based on designs selected by product manager 218. In these illustrative examples, verifier 210 performs a verification of integrated design 236. Verifier 210 is configured to perform a "fly through" through the aircraft to ensure that all components needed for the aircraft are present. This verification is performed using applicable designs 234.

After integrated design 236 is verified, this design becomes final design 238. Product manager 218 uses final design 238 to generate bill of materials 240. Bill of materials 240 is used to order components and materials for manufacturing the aircraft.

In these illustrative examples, manufacturing system 214 generates document 241 for building an aircraft. Document 241 is generated using final design 238 in these illustrative examples. In some cases, document 241 may be or may include final design 238.

In particular, document 241 may be used to build a selected option in the aircraft. This document may be generated using engineering options 235 in final design 238. Document 241 also may be used to build other components, assemblies, and structures in the aircraft.

In these illustrative examples, document 241 may be manufacturing work statement 242. In another illustrative example, document 241 may take the form of work instructions 243.

Manufacturing system 214 also may use final design 238 to identify export build requirements 244. Export build requirements 244 are requirements to ensure that proper export licenses for components in the aircraft are met to allow for the export of the aircraft to another country from the one in which the aircraft is built. In other words, these requirements are used to ensure that the aircraft can be sold in other countries.

Final design 238 is also used by product manager 218 to identify certifications 246 needed for aircraft. Certifications 246 are certifications that are needed based on a group of regulations, such as those promulgated by the Federal Aviation Administration, with respect to airworthiness of the aircraft. In these illustrative examples, the number of certifications 246 required may be reduced through the use of engineering options 235 for options selected for the aircraft.

By reducing the number of certifications 246 required, the time needed to manufacture and deliver an aircraft may be reduced. Further, the cost for certifying designs also may be reduced through the use of pre-certified designs in aircraft option database 233.

Documenter 216 generates maintenance manuals 248 as well as other documents. These documents are in an electronic form that also may be printed for use. Maintenance manuals 248 are used by a customer, a manufacturer, or both to perform maintenance for an aircraft after the aircraft has been manufactured.

The illustration of aircraft manager 200 in FIG. 2 is not meant to imply physical or architectural limitations, the manner in which different illustrative embodiments may be implemented. For example, in some illustrative examples, manufacturing system 214 and documenter 216 may be combined into a single component. In still other illustrative examples, maintenance manuals 248 may be considered reports 250 and may be generated by reporting system 212.

In yet another illustrative example, some functions performed by product manager 218 may be separated into other components. For example, certifications 246 may be placed into a certification system rather than being performed by product manager 218.

Figure 3:
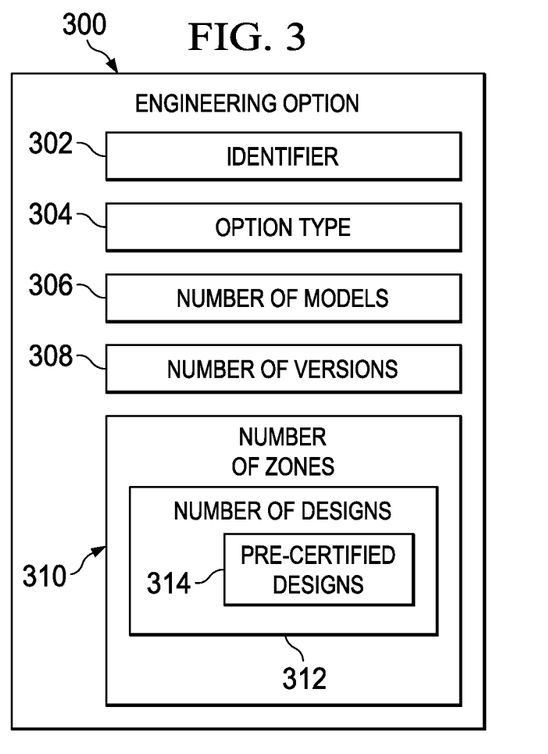
FIG. 3 is an illustration of a block diagram of an engineering option in accordance with an illustrative embodiment.

Turning now to FIG. 3, an illustration of a block diagram of an engineering option is depicted in accordance with an illustrative embodiment. As depicted, engineering option 300 is an example of an implementation for an engineering option in engineering options 132 in FIG. 1 and engineering options 235 in FIG. 2. As depicted, engineering option 300 includes identifier 302, option type 304, number of models 306, number of versions 308, number of zones 310, and number of designs 312.

Identifier 302 identifies engineering option 300. Identifier 302 may be a name, an alphanumeric identifier, or some other suitable type of identifier. In these illustrative examples, identifier 302 is a unique identifier for engineering option 300.

Option type 304 identifies the type of option for engineering option 300. In particular, option type 304 may identify types of monuments that may be located in an aircraft. A monument is a structure in an aircraft.

For example, the option type may be, for example, without limitation, a lavatory, an attendant seat, a galley, and other suitable types of options. Option type 304 is used to determine whether engineering option 300 is applicable to a configuration of an aircraft based on a selection of an option type by a customer. Of course, option type 304 may be applicable to other structures or assemblies other than monuments, depending on the particular implementation.

Number of models 306, number of versions 308, and number of zones 310 are used to determine whether engineering option 300 is applicable to a particular configuration for an aircraft. Number of models 306 identifies one or more models of aircraft for which engineering option 300 may be used. Number of versions 308 may identify one or more versions for number of models 306 for which engineering option 300 may be used.

For example, when a customer selects options for a particular model and version of an aircraft, number of models 306 and number of versions 308 may be used to determine whether engineering option 300 can be used for that model and version selected by the customer for the aircraft.

Further, number of zones 310 also may be used to identify which zones engineering option 300 may be applicable to in an aircraft. Number of zones 310 may be different for different models in number of models 306 and for different versions in number of versions 308.

For example, if a customer selects a particular zone for a particular model and version of an aircraft, a determination may be made as to whether engineering option 300 is applicable for that zone using number of zones 310.

Number of designs 312 is one or more designs for the options selected. In these illustrative examples, number of designs 312 may be, for example, designs generated by computer-aided design system 202 in FIG. 2. In particular, number of designs 312 is designs that meet a group of regulations. More specifically, number of designs 312 may take the form of pre-certified designs 314. Pre-certified designs 314 are pre-certified for number of zones 310 in number of versions 308 for number of models 306 of aircraft that may be configured.

Figure 4:
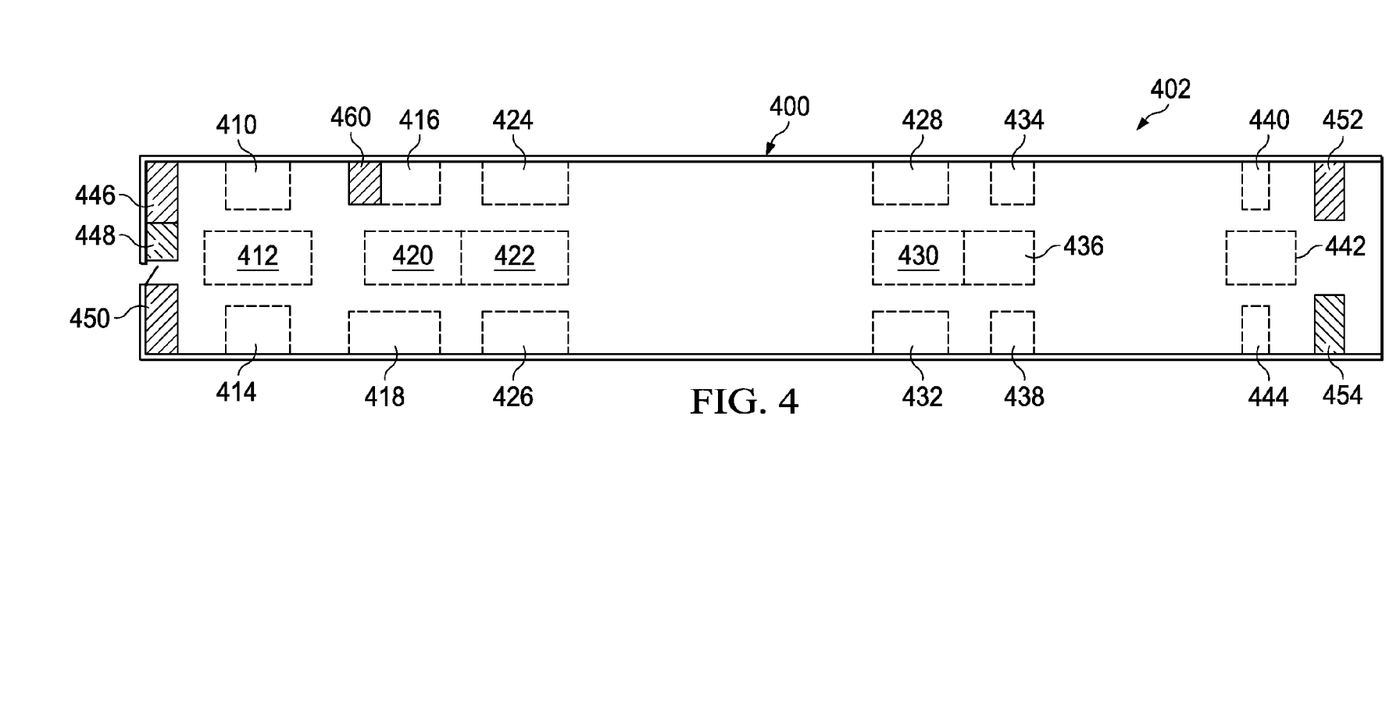
FIG. 4 is an illustration of zones for monuments in an aircraft in accordance with an illustrative embodiment.

With reference now to FIG. 4, an illustration of zones for monuments in an aircraft is depicted in accordance with an illustrative embodiment. In this illustrative example, a view of aircraft 400 with zones 402 is seen is this particular example.

In this particular example, zones 402 are zones in which one or more monuments may be placed. A monument is a structure in aircraft 400. Monuments also may include, for example, without limitation, a lavatory, a galley, an attendant seat, a passenger seat, a luggage bin, a closet, a table, a bar, and other suitable structures.

These different zones in aircraft 400 illustrate locations where a customer may place monuments in an aircraft 400 as options in configuring aircraft 400. As depicted, monuments may be placed within zones 402.

When a monument is placed in one of zones 402, that monument may be built using an engineering option that has a pre-certified design for the monument. As a result, with placement of a monument within one of zones 402, certification of that monument becomes unnecessary and reduces the amount of time needed to build aircraft 400. In this illustrative example, zones 402 include zones 410, 412, 414, 416, 418, 420, 422, 424, 426, 428, 430, 432, 434, 436, 438, 440, 442, 444, 446, 448, 450, 452, and 454. Zones 410 412, 414, 416, 418, 420, 422, 424, 426, 428, 430, 432, 434, 436, 438, 440, 442, and 444 are adaptable zones in these illustrative examples. Zones 446, 448, 450, 452, and 454 are fixed zones.

Adaptable zones are zones in which a monument may be positioned anywhere with a particular zone. A fixed zone is a zone in which the location of the monument is not selectable within the zone. For example, a selection of zone 446 means that the monument has a fixed position within that zone. Further, the position of doors and other features also may be fixed within zone 446.

For example, zone 416 is an adaptable zone in zones 402. The selection of this zone may allow for the monument 460 to be placed anywhere within this zone. For example, the illustration of monument 460 in zone 416 indicates one placement for a monument. Monument 460 may be moved anywhere within zone 416 because zone 416 is an adaptable zone. Also, with zone 416 being an adaptable zone, monuments of different sizes also may be placed within zone 416. The sizes may be those that fit within zone 416 or based on other constraints.

As another example, zone 446 is a fixed zone. A monument in this zone has a fixed position and size. With the placement of monuments, engineering options may be used. These different zones are selected based on resources that are available for the particular option. The resource in this example may be physical attachment points, plumbing, water, and other suitable resources needed for a monument.

The illustration of zones for options in aircraft in FIG. 4 is not meant to imply limitations to the manner in which options may be placed. For example, zones may be present for galleys, lavatories, attendant seats, passenger seats, closets, storage bins, tables, bars, and other suitable types of structures or monuments in an aircraft. Further, these zones also may apply to other types of structures other than monuments in the aircraft.

Figure 5:
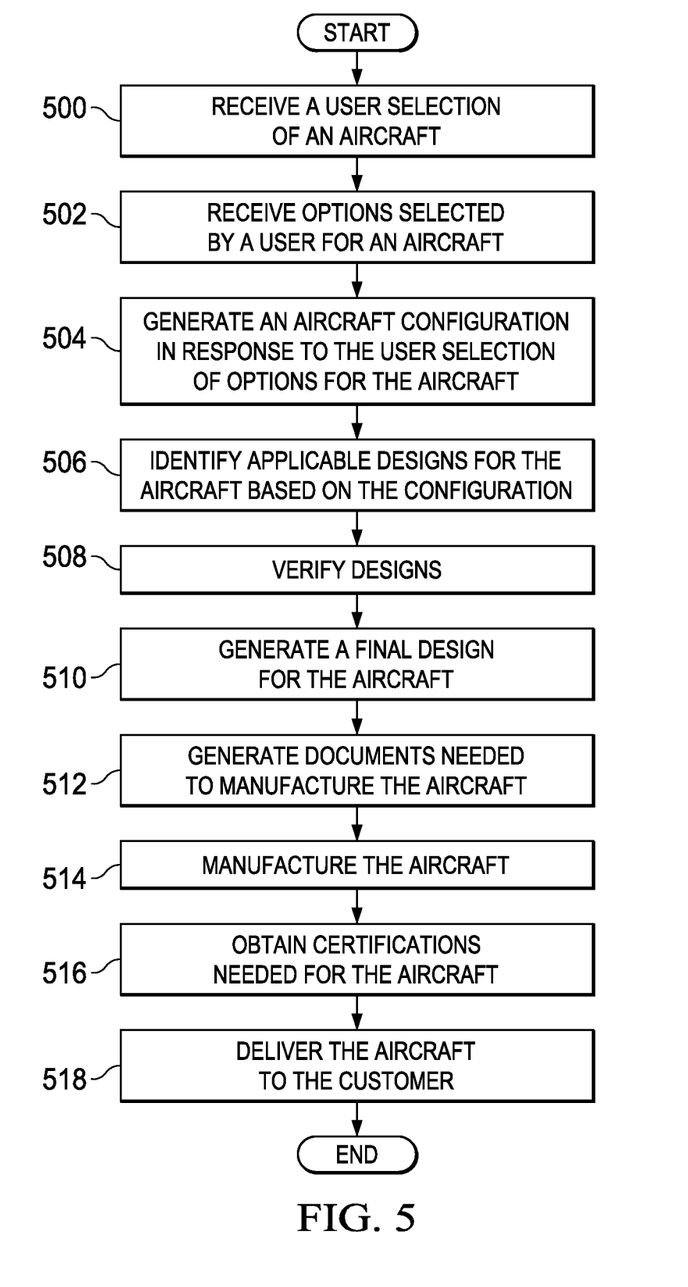
FIG. 5 is an illustration of a flowchart of a process for designing and manufacturing an aircraft in accordance with an illustrative embodiment.

With reference now to FIG. 5, an illustration of a flowchart of a process for designing and manufacturing an aircraft is depicted in accordance with an illustrative embodiment. The process illustrated in FIG. 5 may be implemented using manufacturing environment 100 in FIG. 1 and, in particular, using aircraft manager 200 in FIG. 2.

The process begins by receiving a user selection of an aircraft (operation 500). The selection may include an identification of a model and a version of an aircraft. The process then receives options selected by a user for an aircraft (operation 502). The process generates an aircraft configuration in response to the user selection of options for the aircraft (operation 504).

The process then identifies applicable designs for the aircraft based on the configuration (operation 506). Next, the applicable designs are verified (operation 508). After the applicable designs are verified, a final design is generated for the aircraft (operation 510).

The process generates documents needed to manufacture the aircraft (operation 512). These documents may include, for example, a bill of materials, a manufacturing work statement, work instructions, and other suitable documents. The process then manufactures the aircraft (operation 514). Certifications needed for the aircraft are obtained (operation 516).

Operation 516 may be performed before, during, or after manufacturing the aircraft in operation 514. In these illustrative examples, the number of certifications may be reduced through the use of engineering options that have pre-certified designs. Operation 516 may be unnecessary for each aircraft when multiple aircraft of the same configuration are ordered by a customer. The certifications may only be needed for the first time a particular configuration is manufactured.

In this manner, the time needed to deliver an aircraft to a customer may be reduced. Also, the use of engineering options may reduce the cost of designing and manufacturing an aircraft for a customer. The aircraft is then delivered to the customer (operation 518) with the process terminating thereafter.

Figure 6:
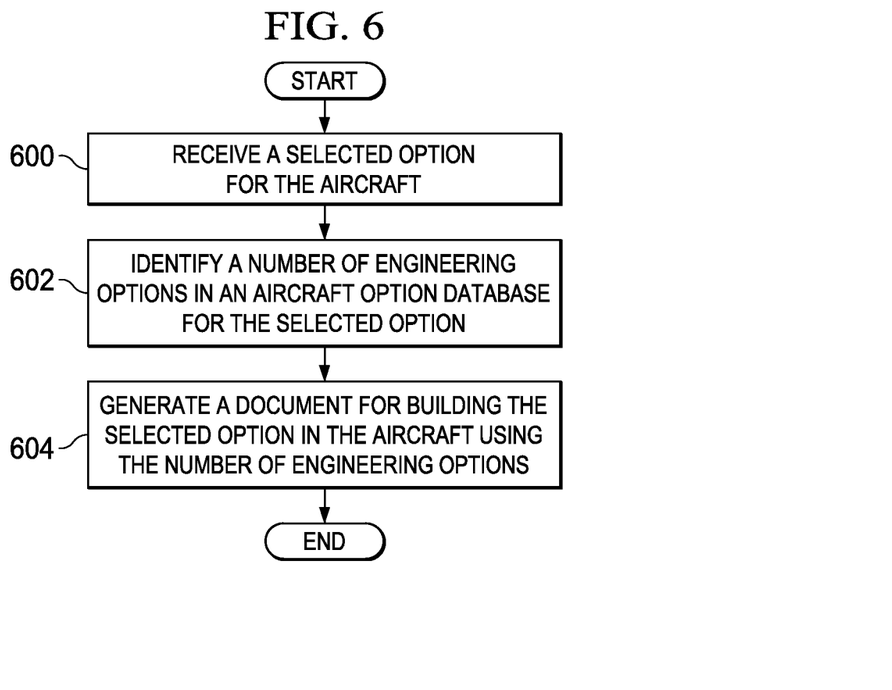
FIG. 6 is an illustration of a flowchart of a process for managing options in an aircraft in accordance with an illustrative embodiment.

With reference now to FIG. 6, an illustration of a flowchart of a process for managing options in an aircraft is depicted in accordance with an illustrative embodiment. The process illustrated in FIG. 6 may be implemented using manufacturing environment 100 in FIG. 1 and, in particular, using aircraft manager 200 in FIG. 2. This process may be used to generate a document to build a particular option selected by a customer.

The process begins by receiving a selected option for the aircraft (operation 600). The process then identifies a number of engineering options in an aircraft option database for the selected option (operation 602). Next, the process generates a document for building the selected option in the aircraft using the number of engineering options (operation 604) with the process terminating thereafter. The document may take various forms. In one illustrative example, the document may be a final design including the number of engineering options associated with resources in which the final design is for building the selected option in the aircraft. Although illustrated for a single selected option, the process in FIG. 6 may be performed for each option selected by a customer.

Figure 7:
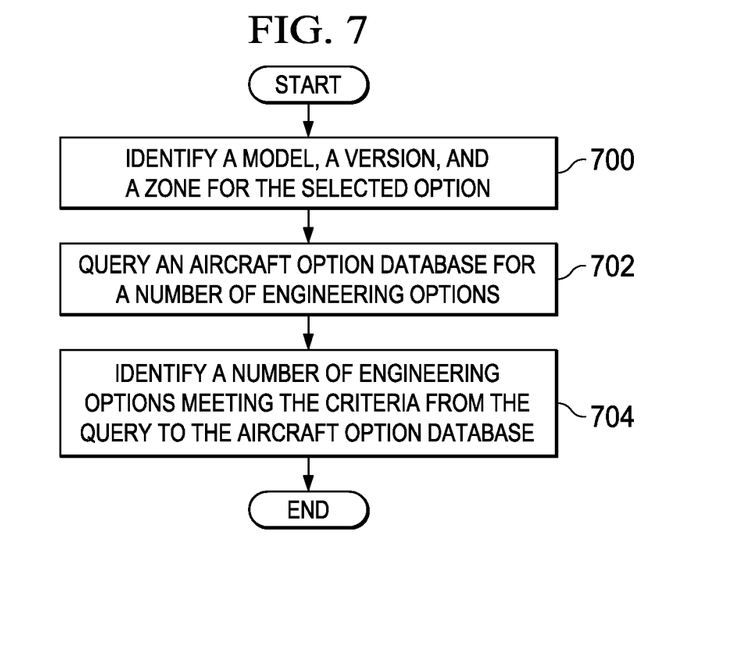
FIG. 7 is an illustration of a flowchart of a process for identifying engineering options in accordance with an illustrative embodiment.

Turning now to FIG. 7, an illustration of a flowchart of a process for identifying engineering options is depicted in accordance with an illustrative embodiment. This process is an example of an implementation of operation 602 in FIG. 6.

The process begins by identifying a model, a version, and a zone for the selected option (operation 700). The process then queries an aircraft option database for a number of engineering options (operation 702). Next, a number of engineering options meeting the criteria is identified from the query to the aircraft option database (operation 704) with the process terminating thereafter.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Figure 8:
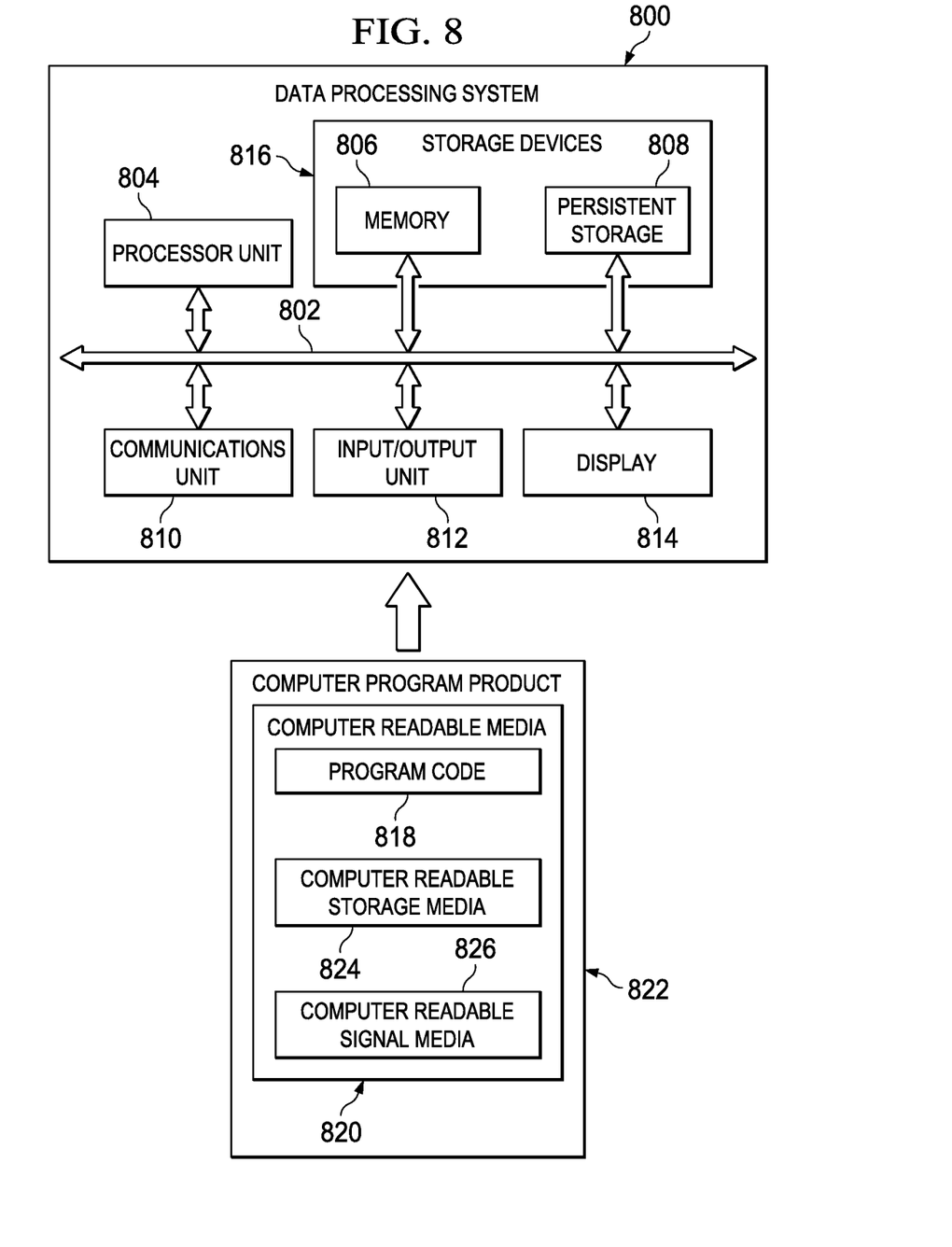
FIG. 8 is an illustration of a data processing system in accordance with an illustrative embodiment.

Turning now to FIG. 8, an illustration of a data processing system is depicted in accordance with an illustrative embodiment. Data processing system 800 may be used to implement one or more of number of computers 122 in computer system 120. In this illustrative example, data processing system 800 includes communications framework 802, which provides communications between processor unit 804, memory 806, persistent storage 808, communications unit 810, input/output (I/O) unit 812, and display 814. In these examples, communications unit 810 may be a bus system.

Processor unit 804 serves to execute instructions for software that may be loaded into memory 806. Processor unit 804 may be a number of processors, a multi-processor core, or some other type of processor, depending on the particular implementation. A number, as used herein with reference to an item, means one or more items. Further, processor unit 804 may be implemented using a number of heterogeneous processor systems in which a main processor is present with secondary processors on a single chip. As another illustrative example, processor unit 804 may be a symmetric multi-processor system containing multiple processors of the same type.

Memory 806 and persistent storage 808 are examples of storage devices 816. A storage device is any piece of hardware that is capable of storing information, such as, for example, without limitation, data, program code in functional form, and/or other suitable information either on a temporary basis and/or a permanent basis. Storage devices 816 may also be referred to as computer readable storage devices in these examples. Memory 806, in these examples, may be, for example, a random access memory or any other suitable volatile or non-volatile storage device. Persistent storage 808 may take various forms, depending on the particular implementation.

For example, persistent storage 808 may contain one or more components or devices. For example, persistent storage 808 may be a hard drive, a flash memory, a rewritable optical disk, a rewritable magnetic tape, or some combination of the above. The media used by persistent storage 808 also may be removable. For example, a removable hard drive may be used for persistent storage 808.

Communications unit 810, in these examples, provides for communications with other data processing systems or devices. In these examples, communications unit 810 is a network interface card. Communications unit 810 may provide communications through the use of either or both physical and wireless communications links.

Input/output unit 812 allows for input and output of data with other devices that may be connected to data processing system 800. For example, input/output unit 812 may provide a connection for user input through a keyboard, a mouse, and/or some other suitable input device. Further, input/output unit 812 may send output to a printer. Display 814 provides a mechanism to display information to a user.

Instructions for the operating system, applications, and/or programs may be located in storage devices 816, which are in communication with processor unit 804 through communications framework 802. In these illustrative examples, the instructions are in a functional form on persistent storage 808. These instructions may be loaded into memory 806 for execution by processor unit 804. The processes of the different embodiments may be performed by processor unit 804 using computer implemented instructions, which may be located in a memory, such as memory 806.

These instructions are referred to as program code, computer usable program code, or computer readable program code that may be read and executed by a processor in processor unit 804. The program code in the different embodiments may be embodied on different physical or computer readable storage media, such as memory 806 or persistent storage 808.

Program code 818 is located in a functional form on computer readable media 820 that is selectively removable and may be loaded onto or transferred to data processing system 800 for execution by processor unit 804. Program code 818 and computer readable media 820 form computer program product 822 in these examples. In one example, computer readable media 820 may be computer readable storage media 824 or computer readable signal media 826. Computer readable storage media 824 may include, for example, an optical or magnetic disk that is inserted or placed into a drive or other device that is part of persistent storage 808 for transfer onto a storage device, such as a hard drive, that is part of persistent storage 808. Computer readable storage media 824 also may take the form of a persistent storage, such as a hard drive, a thumb drive, or a flash memory, that is connected to data processing system 800.

In some instances, computer readable storage media 824 may not be removable from data processing system 800. In these examples, computer readable storage media 824 is a physical or tangible storage device used to store program code 818 rather than a medium that propagates or transmits program code 818. Computer readable storage media 824 is also referred to as a computer readable tangible storage device or a computer readable physical storage device. In other words, computer readable storage media 824 is a media that can be touched by a person.

Alternatively, program code 818 may be transferred to data processing system 800 using computer readable signal media 826. Computer readable signal media 826 may be, for example, a propagated data signal containing program code 818. For example, computer readable signal media 826 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 818 may be downloaded over a network to persistent storage 808 from another device or data processing system through computer readable signal media 826 for use within data processing system 800. For instance, program code stored in a computer readable storage medium in a server data processing system may be downloaded over a network from the server to data processing system 800. The data processing system providing program code 818 may be a server computer, a client computer, or some other device capable of storing and transmitting program code 818.

The different components illustrated for data processing system 800 are not meant to provide architectural limitations to the manner in which different embodiments may be implemented. The different illustrative embodiments may be implemented in a data processing system including components in addition to or in place of those illustrated for data processing system 800. Other components shown in FIG. 8 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 804 may take the form of a hardware unit that has circuits that are manufactured or configured for a particular use. This type of hardware may perform operations without needing program code to be loaded into a memory from a storage device to be configured to perform the operations.

For example, when processor unit 804 takes the form of a hardware unit, processor unit 804 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. With this type of implementation, program code 818 may be omitted because the processes for the different embodiments are implemented in a hardware unit.

In still another illustrative example, processor unit 804 may be implemented using a combination of processors found in computers and hardware units. Processor unit 804 may have a number of hardware units and a number of processors that are configured to run program code 818. With this depicted example, some of the processes may be implemented in the number of hardware units, while other processes may be implemented in the number of processors.

In another example, a bus system may be used to implement communications framework 802 and may be comprised of one or more buses, such as a system bus or an input/output bus. Of course, the bus system may be implemented using any suitable type of architecture that provides for a transfer of data between different components or devices attached to the bus system.

Additionally, a communications unit may include a number of more devices that transmit data, receive data, or transmit and receive data. A communications unit may be, for example, a modem or a network adapter, two network adapters, or some combination thereof. Further, a memory may be, for example, memory 806, or a cache, such as found in an interface and memory controller hub that may be present in communications framework 802.

Figure 9:
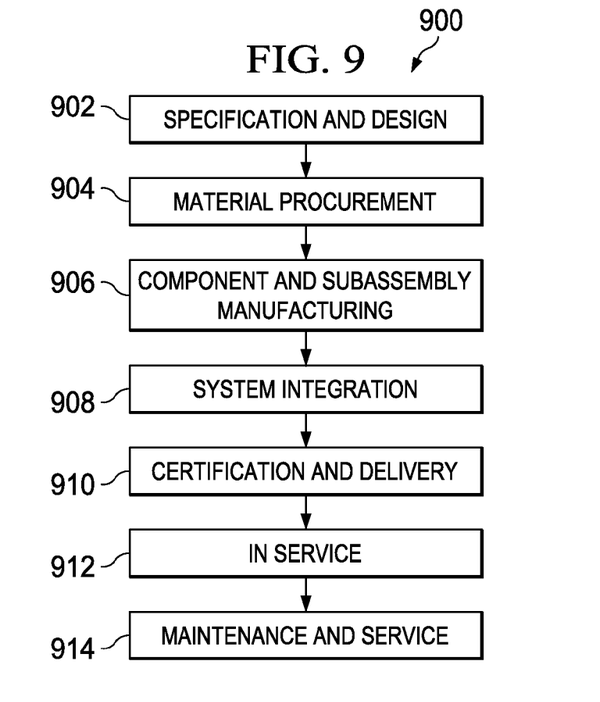
FIG. 9 is an illustration of an aircraft manufacturing and service method in accordance with an illustrative embodiment.
Figure 10:
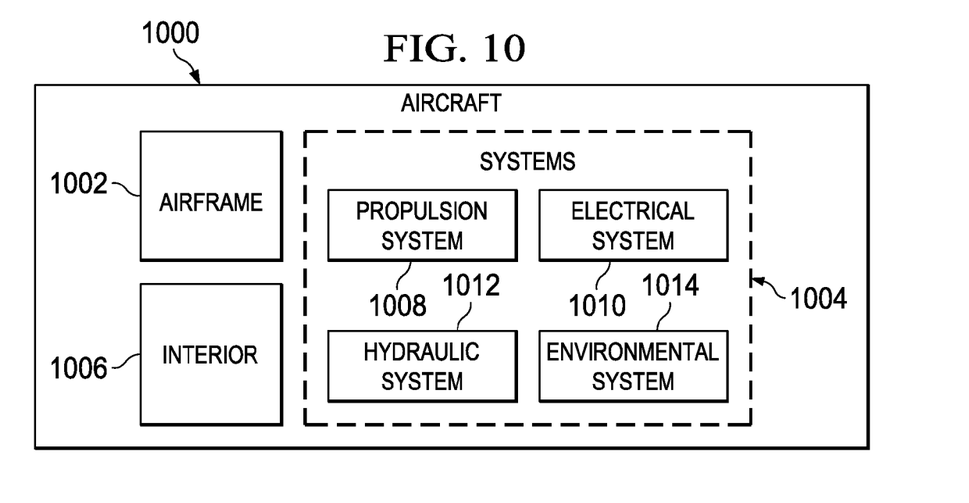
FIG. 10 is an illustration of an aircraft in which an illustrative embodiment may be implemented.

Illustrative embodiments of the disclosure may be described in the context of aircraft manufacturing and service method 900 as shown in FIG. 9 and aircraft 1000 as shown in FIG. 10. Turning first to FIG. 9, an illustration of an aircraft manufacturing and service method is depicted in accordance with an illustrative embodiment. During pre-production, aircraft manufacturing and service method 900 may include specification and design 902 of aircraft 1000 in FIG. 10 and material procurement 904.

During production, component and subassembly manufacturing 906 and system integration 908 of aircraft 1000 in FIG. 10 takes place. Thereafter, aircraft 1000 in FIG. 10 may go through certification and delivery 910 in order to be placed in service 912. While in service 912 by a customer, aircraft 1000 in FIG. 10 is scheduled for routine maintenance and service 914, which may include modification, reconfiguration, refurbishment, and other maintenance or service.

Each of the processes of aircraft manufacturing and service method 900 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 10, an illustration of an aircraft is depicted in which an illustrative embodiment may be implemented. In this example, aircraft 1000 is produced by aircraft manufacturing and service method 900 in FIG. 9 and may include airframe 1002 with plurality of systems 1004 and interior 1006. Examples of systems 1004 include one or more of propulsion system 1008, electrical system 1010, hydraulic system 1012, and environmental system 1014. Any number of other systems may be included. Although an aerospace example is shown, different illustrative embodiments may be applied to other industries that manufacture vehicles. For example, the illustrative embodiments may be applied to other industries, such as the automotive industry, the ship building industry, and other suitable industries.

Apparatuses and methods embodied herein may be employed during at least one of the stages of aircraft manufacturing and service method 900 in FIG. 9.

In one illustrative example, components or subassemblies produced in component and subassembly manufacturing 906 in FIG. 9 may be fabricated or manufactured in a manner similar to components or subassemblies produced while aircraft 1000 is in service 912 in FIG. 9.

In another example, one or more illustrative embodiments may be used during specification and design 902 to reuse previously generated designs for assemblies used in options selected by a customer or the manufacturer. In some cases, the customer may select options for a particular aircraft being ordered. In other illustrative examples, a manufacturer may pre-select options for aircraft 1000.

Further, one or more illustrative embodiments also may be used during maintenance and service 914. An illustrative embodiment may be implemented for use during maintenance and service 914 to select designs for use in options that may be selected for upgrades, refurbishing, or other operations performed on aircraft 1000. The use of a number of the different illustrative embodiments may substantially expedite the assembly of and/or reduce the cost of aircraft 1000.

An option in aircraft 1000 is a deliverable to a customer. This option embodies a final design for the option in which the final design is based on one or more engineering options that have been previously certified. The deliverable to the customer also may include one or more documents that verify that the components for the option, the association to resources for the option, or both match the final design. In this manner, the time needed to add an option to aircraft 1000 may be reduced. This reduction also may reduce the cost to deliver the option to the customer in aircraft 1000.

Thus, the different illustrative embodiments provide a method and apparatus for manufacturing platforms such as aircraft. The different illustrative embodiments provide a product manager that is configured to reuse designs that have been previously certified for use in vehicles. In the illustrative examples, the designs are associated with zones. These zones are selected as ones that provide resources for use by the designs.

In this manner, an aircraft may be manufactured, modified, or upgraded to embody a final design. The final design may be, for example, for the aircraft when the aircraft is manufactured as a deliverable to the customer or for the option if the option is added to the aircraft after the aircraft has been manufactured.

With one or more illustrative embodiments, the time needed to manufacture an aircraft may be reduced. In particular, the time needed for manufacturing monuments based on selections by customers may be reduced because the time and expense needed for certifications may be lessened through the use of engineering options as described above.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An aircraft customization system comprising:
   a number of processors:
   at least one memory;
   an aircraft option database comprising engineering options that have been previously certified and are related to selectable options for an aircraft, the selectable options associated with a model, a version, and a zone, the selectable options selected from at least one of a galley, an attendant seat, a lavatory, a passenger seat, a landing gear, and an engine, wherein an engineering option in the engineering options is a pre-certified design in which the design for the engineering options is put through a process to obtain certification that the engineering option meets a group of regulations promulgated by an aviation administration pertaining to airworthiness of the pre-certified design in the aircraft, the engineering options including at least one three-dimensional model;
   an aircraft configurator coupled to the aircraft option database and configured to receive a selected option of the selected options for the aircraft and identify a number of engineering options that have been previously certified from the engineering options in the aircraft option database for the selected option, to reuse said design that have been previously certified;
   a verifier configured to ensure that all components needed for the aircraft are pre-certified components, based on designs selected by a product manager, which is configured to reuse designs that have been previously certified; and
   a configuration generator coupled to the aircraft configurator and configured to generate a final design reusing previously generated designs including the number of engineering options associated with resources comprising at least one of physical attachment points, utilities, data and other suitable resources, in which the final design is used to build the selected option in the aircraft with the number of engineering options that have been previously certified and were identified in the aircraft option database by the aircraft configurator for the selected option, wherein the configuration generator generates documents needed to manufacture the aircraft which include a bill of materials.

2. The aircraft customization system of claim 1 further comprising:
   an aircraft customizer configured to receive user input selecting an option for the aircraft to form the selected option and send the selected option to the aircraft configurator.

3. The aircraft customization system of claim 1, wherein the configuration generator is configured to generate a document for building the selected option in the aircraft using the number of engineering options identified in the aircraft option database by the aircraft configurator for the selected option, wherein the document is selected from one of a work statement, a manufacturing work statement, and assembly instructions.

4. The aircraft customization system of claim 1, wherein the engineering options are pre-certified designs for assemblies in the aircraft for the options.

5. The aircraft customization system of claim 1, wherein the selected option is selected by one of a customer of a manufacturer and the manufacturer.

6. The aircraft customization system of claim 1, wherein the number of engineering options is identified based on a zone in the zones in which the selected option is located.

7. The aircraft customization system of claim 1,
   wherein to identify the number of engineering options that have been previously certified from the engineering options in the aircraft option database for the selected option, the aircraft configurator is configured to:
      identify the model, the version, and the zone for the selected option to form criteria;
      query the aircraft option database for the number of engineering options; and
      identify the number of engineering options that meet the criteria from the query to the aircraft option database.

8. A vehicle customization system comprising:
   a number of processors;
   at least one memory;
   a database comprising pre-certified designs for options for a vehicle, wherein the pre-certified designs in the database meet a group of regulations on use of the pre-certified designs in the vehicle;
   a vehicle configurator configured to receive a selected option for the vehicle and identify a number of engineering options from engineering options that have been previously certified, include at least one three-dimensional model, and are in the database for the selected option, the selected option associated with a model, a version, and a zone, the selected option selected from at least one of a galley, an attendant seat, a lavatory, a passenger seat, a landing gear, and an engine;
   a verifier configured to ensure that all components needed for the vehicle are pre-certified components, based on designs selected by a product manager, which is configured to reuse designs that have been previously certified; and
   a configuration generator configured to generate a final design reusing previously generated designs including the number of engineering options associated with resources, comprises at least one of physical attachment points, utilities, data and other suitable resources, in which the final design is used to build the selected option in the vehicle with the number of pre-certified designs identified in the database for the selected option, wherein the configuration generator generates documents needed to manufacture the aircraft which include a bill of materials.

9. The vehicle customization system of claim 8 further comprising:
a vehicle customizer configured to receive user input selecting an option for the vehicle to form the selected option and send the selected option to the vehicle configurator.

10. The vehicle customization system of claim 8, wherein the configuration generator is configured to generate a document for building the selected option in the vehicle using the number of engineering options identified in the database by the vehicle configurator for the selected option and wherein the document is selected from one of a work statement, a manufacturing work statement, and assembly instructions.

11. The vehicle customization system of claim 8, wherein the engineering options are pre-certified designs for assemblies in the vehicle for the options.

12. The vehicle customization system of claim 8, wherein the number of engineering options is identified based on a zone in the zones in which the selected option is located.

13. A method for managing options for an aircraft, the method comprising:
receiving a selected option of selectable options for the aircraft;
identifying a number of engineering options that have been previously certified for the selected option, wherein the number of engineering options is in an aircraft option database comprising engineering options related to the selectable options for the aircraft, the selectable options associated with a model, a version, and a zone, the selectable options selected from at least one of a galley, an attendant seat, a lavatory, a passenger seat, a landing gear, and an engine, and an engineering option in the engineering options is a pre-certified design meeting a group of regulations pertaining to airworthiness of the pre-certified design in the aircraft, the engineering options including at least one three-dimensional model;
verifying that all components needed for the aircraft are pre-certified components, based on designs selected by a product manager, which is configured to reuse designs that have been previously certified;
generating a final design reusing previously generated designs including the number of engineering options associated with resources, comprising at least one of physical attachment points, utilities, data and other suitable resources, in which the final design is used to build the selected option in the aircraft with the number of engineering options that have been previously certified and were identified in the aircraft option database for the selected option; and
generating documents needed to manufacture the aircraft which include a bill of materials.

14. The method of claim 13 further comprising:
receiving user input selecting an option for the aircraft to form the selected option.

15. The method of claim 13 further comprising:
generating a document for building the selected option in the aircraft using the number of engineering options identified in the aircraft option database for the selected option, wherein the document is selected from one of a work statement, a manufacturing work statement, and assembly instructions.

16. The method of claim 13, wherein the engineering options are pre-certified designs for assemblies in the aircraft for the options.

17. The method of claim 13, wherein the number of engineering options is identified based on a zone in the zones in which the selected option is located.

* * * * *